United States Patent [19]

Sato et al.

[11] Patent Number: 5,045,637
[45] Date of Patent: Sep. 3, 1991

[54] MAGNETIC SHIELDING MATERIAL

[75] Inventors: Takashi Sato; Toshio Yamada, both of Kawasaki; Masami Kobayashi, Tokyo, all of Japan

[73] Assignee: Nippon Steel Corp., Tokyo, Japan

[21] Appl. No.: 554,082

[22] Filed: Jul. 17, 1990

Related U.S. Application Data

[63] Continuation of Ser. No. 296,207, Jan. 12, 1989, abandoned.

[30] Foreign Application Priority Data

Jan. 14, 1988 [JP] Japan ................. 63-2600[U]

[51] Int. Cl.$^5$ .............................................. H05K 9/00
[52] U.S. Cl. ............................................. 174/35 MS
[58] Field of Search ................... 174/35 MS; 361/424

[56] References Cited

U.S. PATENT DOCUMENTS 4,608,297  8/1986  Shimada et al. ............... 360/125 X
4,632,250 12/1986  Ueda et al. .................... 360/132 X
4,641,213  2/1987  Shimada et al. ................ 360/125

Primary Examiner—Leo P. Picard
Assistant Examiner—D. A. Tone
Attorney, Agent, or Firm—Kenyon & Kenyon

[57] ABSTRACT

A magnetic shielding material is described which has a laminate structure comprising a ferromagnetic sheet having a high saturation magnetic flux density, a ferromagnetic sheet having a high magnetic permeability and a non-magnetic sheet. The high saturation magnetic flux density sheet includes a sheet of mold steel, silicon steel or an iron-cobalt alloy. The high magnetic permeability sheet includes an amorphous alloy foil or a laminate thereof. The magnetic shielding material may further have at least one foil of an electromagnetic wave-shielding material.

12 Claims, 8 Drawing Sheets

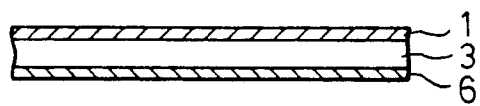
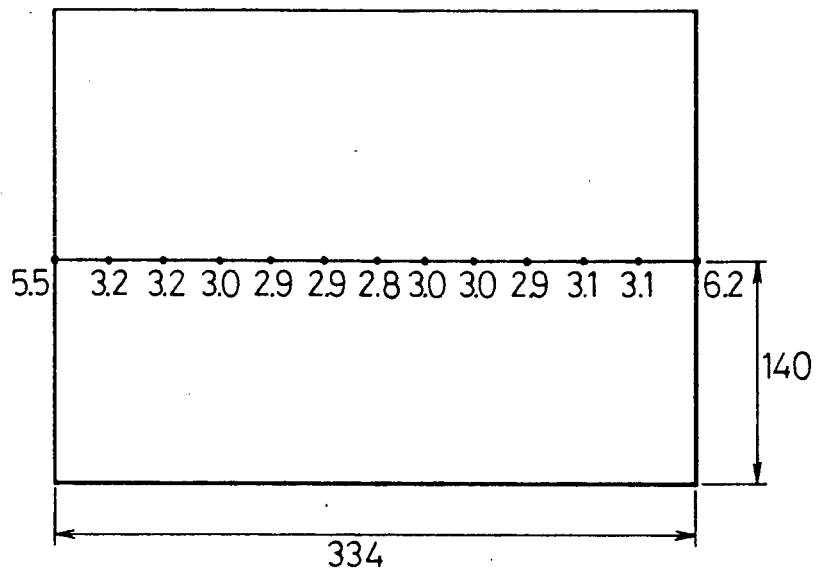

MAGNETIC SHIELDING MATERIAL

BACKGROUND OF THE INVENTION

1. Field of the Invention

This invention relates to a magnetic shielding material for preventing a strong magnetic field generated by a high magnetic field-generating source, such as a superconducting magnet, a normally conducting electromagnet, a superconducting solenoid, a normally conducting solenoid or a high-performance permanent magnet, from leaking to a space outside a predetermined space and avoiding bad influences of a magnetic field leaking to the outside.

2. Description of the Related Art

With recent advance of the magnetism-utilizing technique, the number of machines and apparatuses utilizing a strong magnetic field has been increasing. For example, an apparatus generating a strong magnetic field of 1,500 to 5,000 gauss is used for a magnetic resonance imaging apparatus (ordinarily called "MRI") developed as a medical tomographic means. The intensity of the used magnetic field is more increasing for enhancing the performance.

Furthermore, it is considered that a linear motor car, which is expected to be practically used in the future, will also become a source generating a strong field.

However, such a strong magnetic field causes erroneous operations or functional disturbances in electronic machines or apparatuses such as computers and magnetism-utilizing articles such as magnetic cards. Accordingly, the magnetic field must be cut off by some measure or other. However, the development of means of a high practical utility for cutting off such a strong magnetic field efficiently and assuredly is delayed at the present.

For example, for the above-mentioned MRI, a method is ordinarily adopted in which the magnetic field is cut off by attaching thick iron plates having a large thickness of approximately 2 cm to six faces, that is, four wall faces, the ceiling and the floor, of a chamber in which MRI is set. According to this method, it is possible to reduce the magnetic field of about 100 gauss on the wall face in the chamber to less than 5 gauss on the wall face outside the chamber.

However, this method in which the chamber is surrounded by thick iron plates has problems in that, since the weight reaches scores of tons, technical problems arise in connection with construction and working, and the construction expenses drastically increase.

A method in which a sheet of Permalloy (50Fe-50Ni) is used instead of the thick iron plate has been proposed. Permalloy has a higher magnetic permeability than that of the iron plate, but since the saturation magnetic flux density is low, the magnetization is easily saturated and Permalloy is not sufficiently advantageous over a mild steel sheet. Moreover, it has been found that in Permalloy, the magnetic permeability is remarkably reduced at points where a stress is imposed by processing or points where welding is carried out for connection, and the magnetic field leaks to the outside from these points. For this reason, it is not practical to use Permalloy as a shielding material for cutting off a strong magnetic field at the present.

SUMMARY OF THE INVENTION

It is a primary object of the present invention to provide a magnetic shielding material which has an excellent magnetic shielding property for cutting off a strong magnetic field, having a light weight and having an excellent handling property and construction workability.

In accordance with the present invention, there is provided a magnetic shielding material having a laminate structure comprising a ferromagnetic sheet having a high saturation magnetic flux density, a ferromagnetic sheet having a high magnetic permeability and a non-magnetic sheet. By the term "high saturation magnetic flux density" used herein we mean that the saturation flux density is at least 1.5 tesla. By the term "high magnetic permeability" used herein we mean that the specific initial permeability is at least 1000.

BRIEF DESCRIPTION OF THE DRAWINGS

FIG. 7 is a sectional view illustrating another example of the magnetic shielding laminate of the present invention formed by using a thick amorphous alloy foil;

FIG. 8 is a diagram illustrating the magnetic shielding effect of the magnetic shielding laminate shown in FIG. 7;

FIG. 17 is a diagram illustrating the rusting conditions.

DESCRIPTION OF THE PREFERRED EMBODIMENTS

Figure 1A:
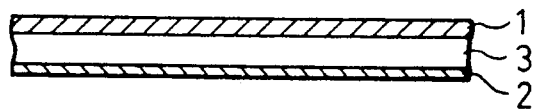
FIG. 1-(a) a sectional view illustrating an example of the magnetic shielding laminate of the present invention, and FIG. 1-(b) is a sectional view of a comparative magnetic shielding material.

According to the present invention, by using in combination ferromagnetic sheets differing in characteristics such as saturation magnetic flux density and magnetic permeability, efficient magnetic shielding becomes possible, and by laminating these ferromagnetic sheets with a non-magnetic sheet, the weight can be reduced and the handling property and construction workability can be improved.

A layer of at least one member selected from the group consisting of mild steels, silicon steels and iron-cobalt alloys is used as the ferromagnetic sheet having a high saturation magnetic flux density in the present invention. Two or more of such ferromagnetic sheets can be used in combination. For the purpose of reducing the weight, preferably the total thickness of the ferromagnetic sheet having a high saturation magnetic flux density be 0.1 to 5 mm, more preferably 0.3 to 3 mm.

The ferromagnetic sheet having a high magnetic permeability is composed of an amorphous alloy foil, a laminate thereof, an annealed amorphous alloy foil or a laminate thereof. The total thickness of the amorphous alloy foil or foils used as the ferromagnetic sheet having a high magnetic permeability is 50 to 1,000 μm, preferably 100 to 500 μm. Since the thickness of an amorphous alloy foil is ordinarily 20 to 40 μm, about 2 to about 25 amorphous alloy foils should be laminated in the magnetic shielding material of the present invention.

Recently, it has become possible to obtain an amorphous alloy foil having a large thickness of 50 μm or more or a thickness exceeding 100 μm according to a process as disclosed in Japanese Examined Patent Publication No. 63-40629. If such a thick amorphous alloy foil is used, the number of laminated foils can be reduced and the efficiency of processing the laminate can be increased. Moreover, a thick amorphous alloy foil is practically advantageous in that the foil shows a magnetic permeability close to that of the annealed foil in the as-cast state and the sensitivity to stress is relatively low. The number of the ferromagnetic sheets to be laminated and the total thickness thereof should be appropriately selected with the above-mentioned ranges in view of the intensity of the magnetic field to be cut off.

The non-magnetic sheet used for the magnetic shielding laminate of the present invention is selected preferably from plywoods, resin sheets, card boards, honeycomb plates, gypsum board, and rubber sheets. The non-magnetic sheet is interposed between the ferromagnetic material having a high saturation magnetic flux density (hereinafter referred to as "high saturation magnetic flux density material") and the amorphous foil as the ferromagnetic material having a high magnetic permeability or between the magnetic materials of the same kind.

The role of the non-magnetic material is to prevent deformation of the thin magnetic materials by their own weights or external forces, and moreover, the non-magnetic material exerts the function of increasing the magnetic resistance between the high saturation magnetic flux density material and the amorphous alloy foil and weakening the magnetic field arriving at the amorphous alloy foil. The layer of the non-magnetic material may be interposed only between the high saturation magnetic flux density material and the amorphous alloy material, and furthermore, another layer of the non-magnetic material may be interposed between the ferromagnetic material sheets. The thickness of the non-magnetic material sheet is not particularly critical, but the thickness should be determined in view of the strength and shielding property of the laminate and other factors.

In the magnetic shielding material of the present invention, the basic lamination order is an order of high saturation magnetic flux density material (HB)—non-magnetic material (NM)—amorphous alloy material (AM). Needless to say, the following variations are included.

1) NM—HB—NM—AM
2) HB—NM—AM—NM
3) NM—HB—NM—AM—NM
4) NM—HB—NM—HB—NM—AM—NM
5) NM—HB—NM—AM—NM—AM—NM

However, where the high saturation magnetic flux density material (HB) has high mechanical strengths, the interposition of the non-magnetic material (NM) between the high saturation magnetic flux density material (HB) and the amorphous alloy material (AM) is not always necessary. For example, the following lamination orders are included.

6) HB—AM—HB
7) NM—HB—AM—HB
8) NM—HB—AM—HB—NM

When the magnetic shielding material is actually used, it is important that the laminate is arranged so that the high saturation magnetic flux density material confronts a magnetic field-generating source.

In the present invention, an amorphous foil must be used as the material having a high magnetic permeability, but Permalloy, Supermalloy and the like can be used as an auxiliary material.

The reason why the amorphous alloy material is used as an indispensable material is that the amorphous alloy material has a high magnetic permeability and has high toughness and high elasticity suitable for a structural material, and the amorphous alloy material is advantageous in that even if the amorphous alloy material is deformed by a stress imposed during handling, since the elasticity is high, the shape is restored on release of the stress and simultaneously, the high magnetic permeability is restored.

The composition of the amorphous alloy foil used for the magnetic material of the present invention will now be described. The amorphous alloy foil is composed of an alloy having a chemical composition represented as $Fe_a$—$X_b$—$M_c$. X stands for at least one member selected from the group consisting of Co, Ni, Cr, Mo, Nb, V and Mn, and M stands for a metalloid element, that is, at least one member selected from the group consisting of B, Si, C, P and Ge. The content of Co or Ni as X is 0 to 40 atomic % in the range not exceeding the content of Fe, and the total content of the metalloid element is 10 to 30 atomic %. The balance consists of Fe and unavoidable impurities.

The present invention will now be described in detail with reference to an embodiment directed to the magnetic shielding of MRI.

In order to increase the operation efficiency in construction of a shield room, preferably the laminate be formed into a panel structure. For example, a laminate panel having a size of 910 mm × 1820 mm is handy to convey and has a general-purpose property. Of materials necessary for formation of this panel, sheets of mild steel and silicon steel having this size are easily available, and plywoods or resin sheets having this size, as the non-magnetic sheet, are similarly easily available. However, the amorphous alloy material involves a problem. At the present, in the amorphous alloy material, the attainable largest width is 100 to 200 mm, and increase of the width is desired. Accordingly, in the case of an amorphous alloy material having a narrow width, the width must be increased.

The technique of increasing the width of an amorphous alloy foil was already developed by one of the inventors. According to this technique, Cu or Sn is plated on an amorphous alloy foil without rendering the amorphous alloy foil brittle, and soldering is effected on this surface plating layer (see Japanese Unexamined Patent Publication No. 61-253384).

The inventors prepared a broad amorphous alloy material foil having a width of 910 mm by bonding 10 Cu-plated amorphous alloy foils having a width of 100 mm to one another in the width direction. However, the width-increasing method is not limited to this method. For example, there can be used a method in which amorphous foils are bonded and fixed by an adhesive or a thin resin sheet. Not only an amorphous alloy foil which is plated only in the portion to be welded but also an amorphous alloy foil having the entire surface plated can be used. In the latter case, the corrosion resistance and other properties are improved. Whether or not the amorphous alloy foil is annealed is determined according to which of the shielding characteristic and the mechanical strength is regarded as being more important. The reason is that when the amorphous alloy foil is annealed, the magnetic permeability is improved but the amorphous alloy foil tends to be brittle.

Thus, all of the materials constituting the laminate panel as one embodiment of the magnetic shielding material of the present invention are prepared.

Figure 16:
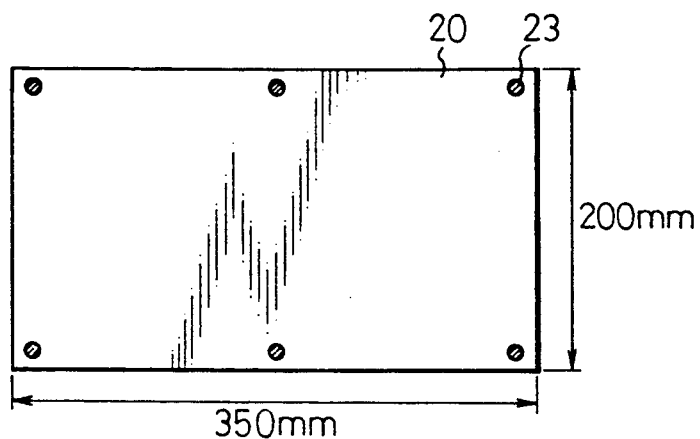
FIG. 16 is a plane view showing another example of a panel comprising the magnetic shielding material of the present invention.
Figure 17:
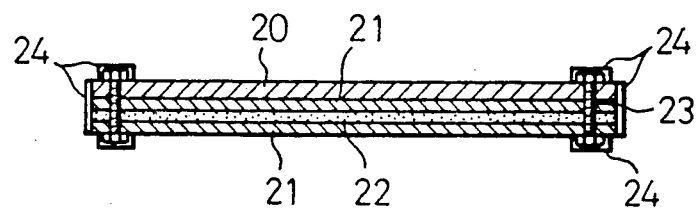
FIG. 17 is a sectional view showing the panel illustrated in FIG. 16.

The thus-prepared materials are cut into predetermined sizes and assembled into a laminate panel. The layers of the laminate panel are secured together, for example, by an adhesive so that the laminate panel can be handled as an integral structure. The layers of the laminate panel may be bolted into an integral structure as illustrated in FIG. 16 and FIG. 17. The bolts 24 used are preferably made of a non-magnetic material such as copper, a copper alloy, aluminum or an aluminum alloy.

Where the ferromagnetic sheet used is corrosive, the ferromagnetic sheet should be coated with an anti-corrosive material and, preferably, side end portions of the laminate panel is covered and sealed with a polymeric material to prevent penetration of moisture into the panel. Preferably, bolt holes are simultaneously sealed with the polymeric material to enhance the anticorrosion.

The magnetic shielding material of the present invention has a laminate structure comprising a ferromagnetic sheet having a high saturation magnetic flux density, a ferromagnetic sheet having a high magnetic permeability, and a non-magnetic sheet can be used as a laminate panel as described above, which is arranged to surround a chamber in which a source for generating a strong magnetic field is located, or the magnetic shielding material can be used in the form of an enclosure or cover having a relatively small size, which surrounds a source for generating a strong magnetic field.

When the corner portions of the so-constructed structure is rounded to form arcuate corners, the shielding effect of cutting off a magnetic field is further improved.

As a modified embodiment of magnetic shielding material of the present invention, a layer composed of at least one foil of an electromagnetic wave-shielding material may be incorporated in the laminate structure. A copper foil, an aluminum foil or a brass foil is used as the layer of the electromagnetic wave-shield material. The thickness of this electromagnetic wave-shielding layer is not particularly critical, but the thickness is ordinarily 30 to 2,000 $\mu$m, preferably 30 to 1,000 $\mu$m. By the combined use of the electromagnetic wave-shielding layer, the laminate has an effect of shielding simultaneously both of the magnetic field and electromagnetic wave.

Where a laminate panel exhibiting an effect of shielding simultaneously both of the magnetic field and electromagnetic wave is constructed, the number and arrangement of laminated layers of the laminate should be determined in view of the intensity of the magnetic field-generating source and the arrangement position of the laminate. The lamination order of the constituent materials of the panel is not particularly limited, but preferably a ferromagnetic sheet having a high saturation magnetic flux density, a foil or foils of an electromagnetic wave-shielding material, a non-magnetic reinforcing sheet, an amorphous alloy foil or foils, and a non-magnetic reinforcing sheet are laminated in this order, and the panel is used in the state where the high saturation magnetic flux density material confronts the interior of the room. The reason is that it is preferred that a strong magnetic flux emitted from an apparatus arranged in a room, for example, a nuclear magnetic resonance tomographic apparatus, be first shielded by the high saturation magnetic flux density material.

Where the entire surface of the room is covered with the laminate panel of the present device, it is preferable that individual electromagnetic waveshielding material foils are bonded by soldering or the like to prevent leakage of the electromagnetic wave from the portion where the panels are connected to each other. Thus, it is preferred that the size of the electromagnetic wave-shielding material foil be larger than the size of the other constituents of the laminate panel. The electromagnetic wave-shielding material foil can be laminated as the outermost layer, but since the foil is readily damaged, the electromagnetic wave-shielding foil preferably laminated next to the high saturation magnetic flux density material sheet. If the electromagnetic wave-shielding material foil is thus laminated, the electromagnetic wave-shielding material foil having a larger size can be taken out outside the panel and soldering can be conveniently performed in the room having a large operation area.

The amorphous alloy foil can be then laminated to completely shield the magnetic field, and in this case, since also the precedent electromagnetic wave-shielding material layer is usually in the form of a foil, for the construction's reason, preferably the reinforcing sheet be interposed between the two foil layers. The shape of the panel is not particularly limited, and even a panel having a circular shape or an L-figured shape can be prepared.

The present invention will now be described in detail with reference to the following examples.

Example 1

Figure 1B:
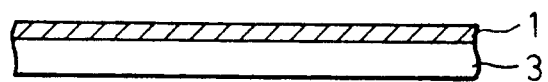
Figure 2:
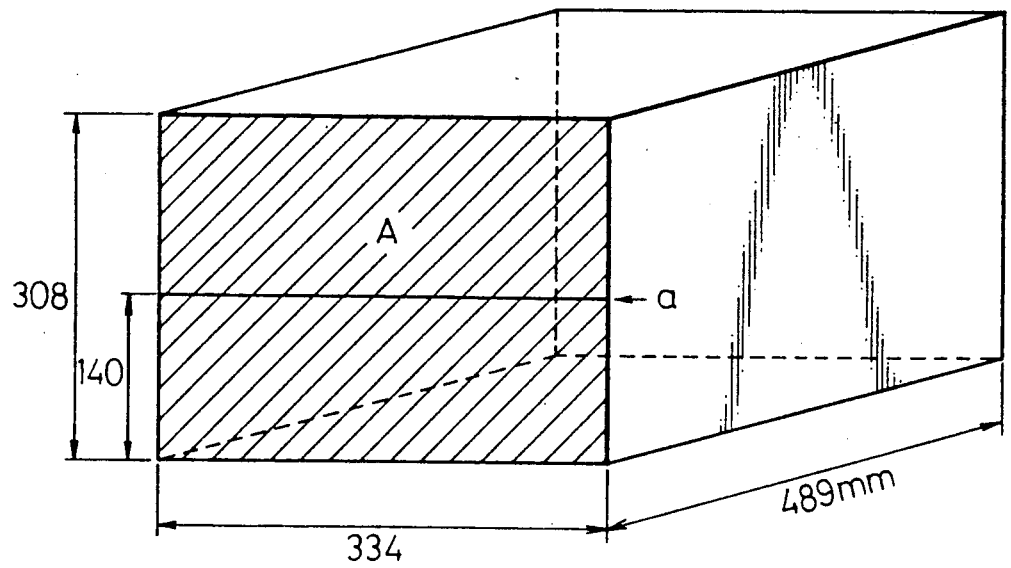
FIG. 2 is a diagram illustrating the shape and size of a box prepared by using the magnetic shielding material of the present invention for testing the magnetic shielding effect.

As shown in FIG. 1-(a), one mild steel sheet 1 having a thickness of 1.6 mm as the high saturation magnetic flux density material, 10 Cu-plated amorphous alloy foils 2 having an alloy composition of $Fe_{80.5}Si_{6.5}B_{12}C_1$ (atomic %) and a thickness of 25 μm, which were width-broadened by soldering, as the amorphous alloy material, and one plywood 3 having a thickness of 4 mm as the non-magnetic sheet were laminated and bonded, as shown in FIG. 1-(a), to form a laminate having a thickness of about 6 mm. A box-like enclosure as shown in FIG. 2 was made by using the so-prepared laminate so that the amorphous alloy material layer 2 was located on the outer side. In FIG. 2 numerals indicate lengths in mm and a indicates the measuring line.

The face confronting the wall A was left blank. The amorphous alloy material was used in the unannealed state.

Figure 3:
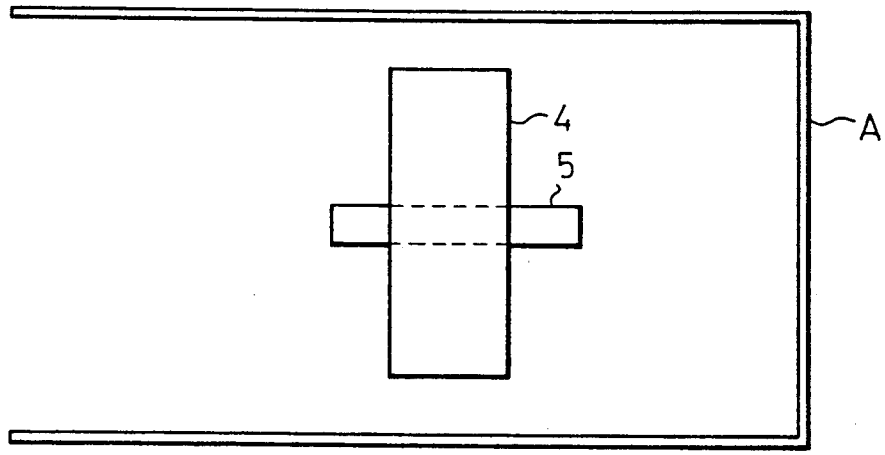
FIG. 3 is a conceptual diagram (plane view) illustrating example of the test conditions.
Figure 4:
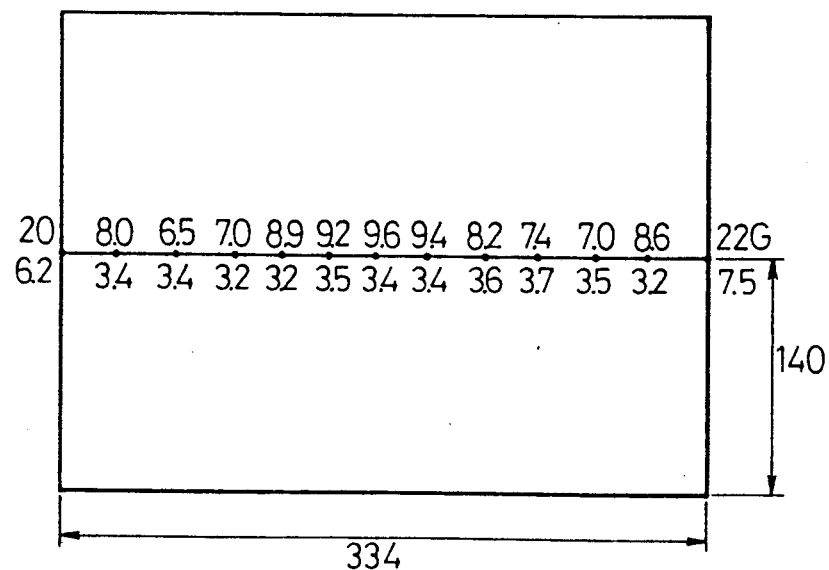
FIG. 4 is a diagram showing the magnetic shielding effects of the magnetic shielding material illustrated in FIG. 1-(a) and the comparative magnetic shielding material illustrated in FIG. 1-(b)

A solenoid 4 having an iron core 5, which was capable of generating a magnetic field of 2,000 gauss at highest on the magnetic pole face was placed in the enclosure, as shown in FIG. 3, and the solenoid 4 was adjusted so that the intensity was 100 gauss at the position of a height of 140 mm (shown by the line a in FIG. 2; the same height as that of the center of the magnetic pole) on the inside of the wall A. In this state, the intensity of the magnetic field in the horizontal direction of a height of 140 mm on the outside of the wall A was measured. The results are shown in FIG. 4. In FIG. 4, values of the lower stage are those obtained with respect to the laminate of this example and values of the upper stage are those of magnetic field intensities at the same positions as described above in a laminate comprising a mild steel sheet 1 having a thickness of 1.6 mm and a plywood 3 having a thickness of 4 mm as shown in FIG. 1-(b).

From the results shown in FIG. 4, it is seen that the laminate of the present invention having an amorphous alloy foil layer has a magnetic shielding effect 2 to 3 times as high as that of the comparative laminate having no amorphous alloy foil. The intensity of the external magnetic field of the laminate of this example except both the end portions is lower than the standard value for MRI, that is, 5 gauss.

EXAMPLE 2

Figure 5:
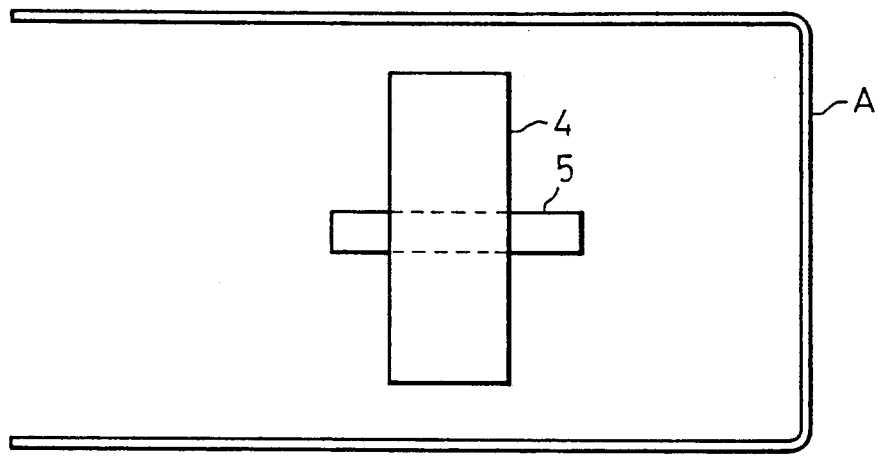
FIG. 5 is a conceptual diagram showing an improved magnetic shielding material having quadrilateral sheet form having the rounded corner portions.
Figure 6:
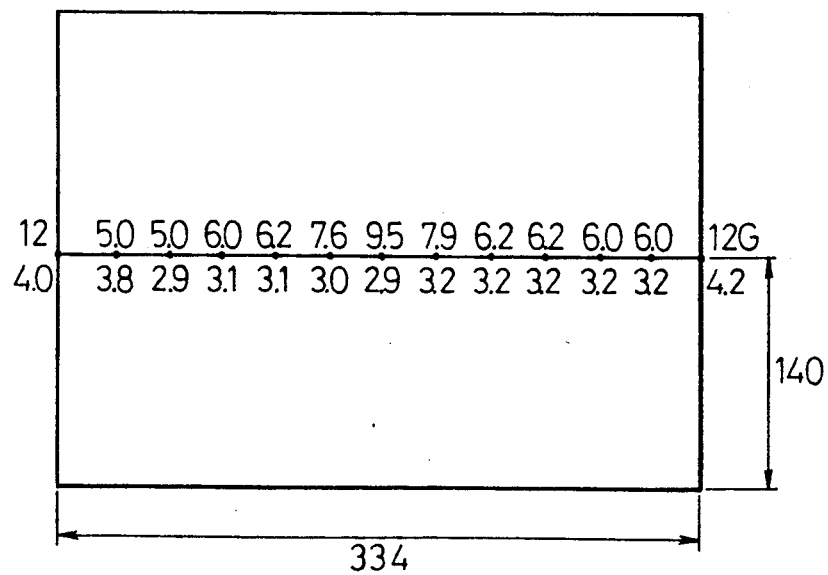
FIG. 6 is a diagram illustrating the magnetic shielding effects of the magnetic shielding material illustrated in FIG. 1-(a) and the comparative magnetic shielding material illustrated in FIG. 1-(b)

The experiment of Example 1 was repeated wherein the enclosure of the magnetic shielding material was modified, namely, the corner portions of the enclosure were rounded with a radius of about 10 mm as shown in FIG. 5. The intensities of the magnetic field on the outside of the wall A were as shown in FIG. 6. The intensities were lower than 5 gauss at all of the positions including both end portions (corner portions). Furthermore, the magnetic shielding efficiency was improved and higher than that of the comparative material.

It was found that, to obtain a shielding effect equivalent to the effect attained by the magnetic shielding material of the present invention only by using a mild steel sheet, a mild steel sheet having a thickness of 10 mm was necessary. However, since a residual magnetization of about 5 gauss was found in the steel sheet, this mild steel sheet was not preferred from the viewpoint of the shielding effect of cutting off the magnetic field as well as the weight increase.

EXAMPLE 3

A box-like enclosure having the same shape and size as shown in FIG. 2 was made by using a laminate having a section as shown in FIG. 7. The laminate was made of a mild steel sheet 1 a plywood 3, which were the same as those used in Example 1, and an amorphous alloy layer 6 composed of three amorphous alloy foils. The three amorphous alloy foils were used in the unannealed state, and each foil used had a thickness of 85 μm and a composition of $Fe_{79}Si_8B_{13}$ (atomic %).

The same iron-cored solenoid as used in Example 1 was placed in this enclosure as shown in FIG. 3, and the solenoid was adjusted so that the intensity of the magnetic field on the inside of the wall A was 100 gauss. Also in this example, the laminate was arranged so that the mild steel sheet was located on the inner side of the enclosure and the amorphous alloy foil layer on the outer side of the enclosure. The intensities of the magnetic fields on the outside of the wall A under the above-mentioned conditions are shown in FIG. 8. as compared with the magnetic shielding laminate of Example 1 having 10 amorphous alloy foils having a thickness of 25 μm, the magnetic shielding laminate of the present example showed an equivalent or higher shielding effect, though the number of the amorphous alloy foils was reduced to 3. Use of a thick amorphous alloy foil was also advantageous from the viewpoint of the efficiency of processing of the laminate.

EXAMPLE 4

In this example, the magnetic shielding material of the present invention was tested for its magnetic shielding effects for a relatively low magnetic field.

Figure 9:
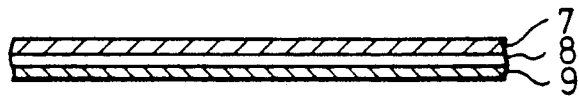
FIG. 9 is a sectional view illustrating still another example of the magnetic shielding laminate of the present invention.
Figure 10:
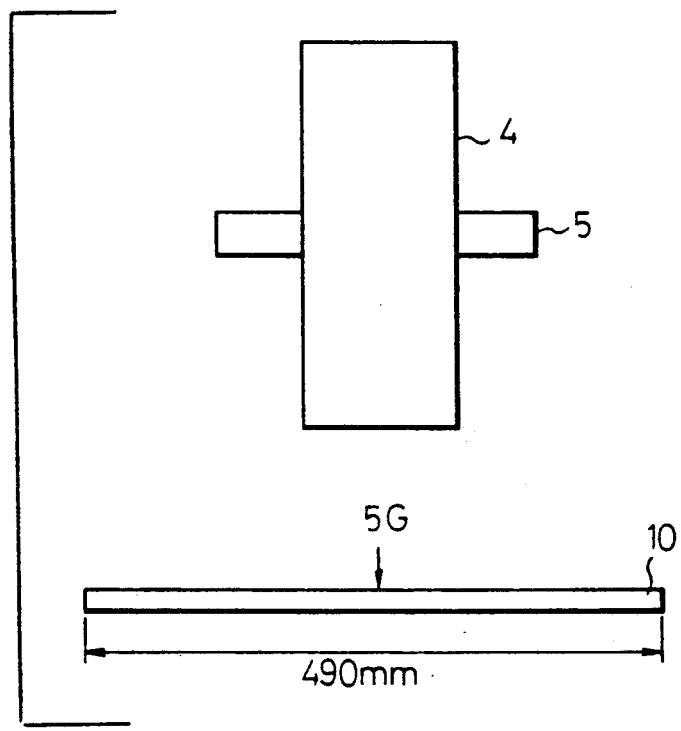
FIG. 10 is a conceptual diagram (plane view) illustrating another example of the test conditions.
Figure 11:
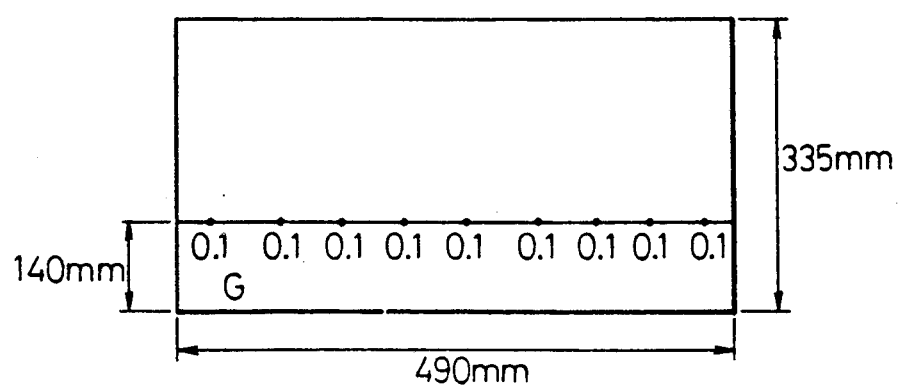
FIG. 11 is a diagram showing the magnetic shielding effects of the magnetic shielding laminate illustrated in FIG. 9.

As shown in FIG. 9, a magnetic shielding laminate was made of four non-oriented silicon steel sheets 7 each having a thickness of 0.35 mm, a phenol-formaldehyde resin (Bakelite) sheet 8 having a thickness of 2.0 mm, and ten amorphous alloy foils 9 each having a thickness of 25 μm and an alloy composition of $Fe_{70}Co_{10}Cr_4B_{12}C_4$ (atomic %). The same solenoid 4 having an iron core 5 as that used in Examples 1, 2 and 3, and the magnetic shielding laminate 10 were arranged as illustrated in FIG. 10 so that the silicon steel sheets confronted the solenoid 4. The intensity of the magnetic field was adjusted to 5 gauss on the face of the laminate 10 confronting the solenoid 4. The intensity of the magnetic field in the horizontal direction of a height of 140 mm on the opposite side of the laminate 10 was about 0.1 gauss as illustrated in FIG. 11. Thus, it was confirmed that the magnetic shielding material of the present invention exhibits enhanced magnetic shielding effects for a relatively low magnetic field.

EXAMPLE 5

Figure 12:
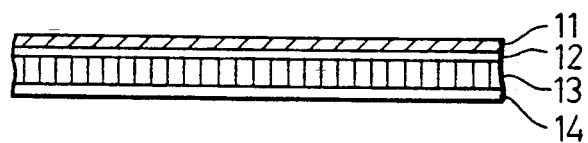
FIG. 12 is a sectional view illustrating still another example of the magnetic shielding laminate of the present invention.
Figure 13:
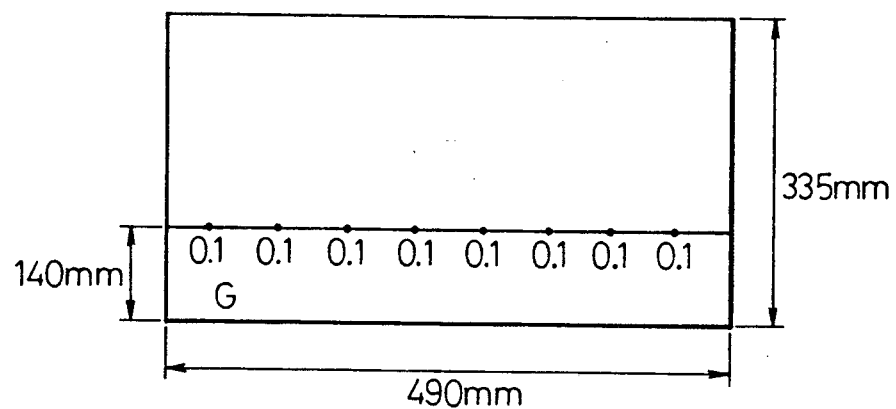
FIG. 13 is a diagram showing the magnetic shielding effects of the magnetic shielding laminate illustrated in FIG. 12.

As shown in FIG. 12, a magnetic shielding laminate was made of a nonmagnetic plastic sheet 11 having a thickness of 2 mm, two directional silicon steel sheets 12 each having a thickness of 0.3 mm, an aluminum honeycomb plate 13 having a thickness of 25 mm, and three Cu-plated amorphous alloy foils 14 each having a thickness of 25 μm and an alloy composition of $Fe_{72}Co_{10}Mo_2B_{12}C_4$ (atomic %). The magnetic shielding effects of the laminate were tested under the same conditions as used in Example 4. The intensity of the magnetic field on the opposite side of the laminate was about 0.1 gauss as illustrated in FIG. 13.

EXAMPLE 6

Figure 14:
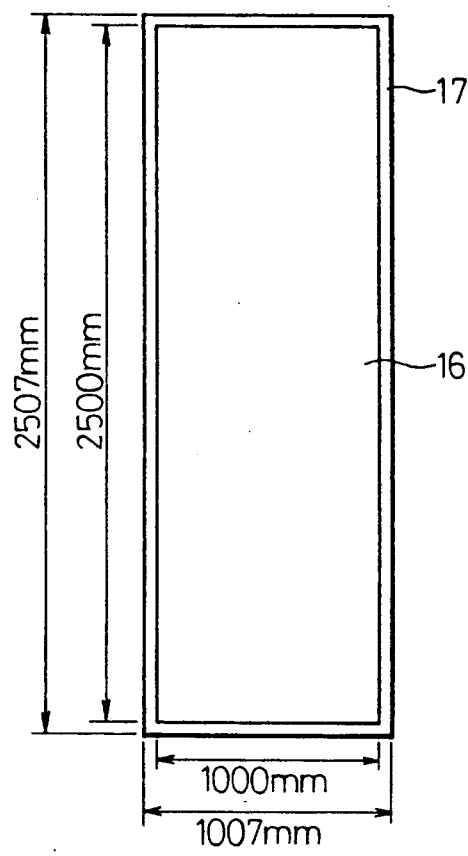
FIG. 14 is a plane view showing an example of a panel comprising the magnetic shielding material of the present invention.
Figure 15:
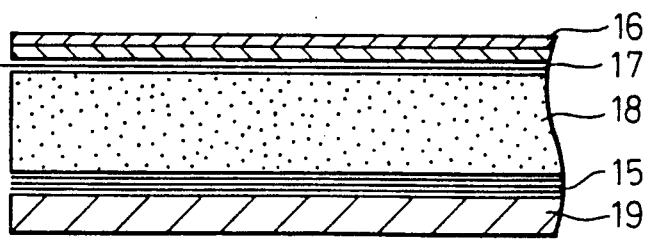
FIG. 15 is a sectional view showing a side end portion of the panel shown in FIG. 14.

As shown in FIGS. 14 and 15, a laminate structure was made from two silicon steel plates 16 each having a thickness of 0.5 mm, one copper foil 17 having a thickness of 35 μm, one gypsum board 18 having a thickness of 15 mm, four amorphous alloy foils 15 each having an alloy composition of $Fe_{92}Si_5B_3$ (% by weight) and a thickness of 35 μm, and one plywood (veneer plywood) 19 having a thickness of 5 mm. The size of the copper foil 17 was larger than the size of the panel. One instance of these sizes is illustrated in FIG. 14.

The surfaces except the floor surface, that is, the five surfaces of the walls and ceiling of a photographing room for a nuclea magnetic resonance tomographic apparatus comprising a superconductive magnet of 0.5 tesla are covered with connected panels having the above-mentioned laminate structure so that the silicon steel plate 16 confronts the interior of the room, and the side end portions of the copper foiis 17 of every two adjacent panels are connected by soldering.

The magnetic shielding effect to the outside of the so-constructed photographing apparatus was measured. At the position which received a magnetic field intensity of 10 gauss in the interior of the room, the intensity was reduced to 1.4 gauss outside the room, and at the position which received a magnetic field strength of 5 gauss in the interior of the room, the magnetic field was reduced to 0.8 gauss outside the room. Since the intended reduction of the magnetic field from 10 gauss to a level lower than 3 gauss or from 5 gauss from a level lower than 1 gauss was attained in the controlled area, the function of a computer and cathode ray tube (CRT) operated outside the photographing room was not influenced by the leaking magnetic flux and the computer and cathode ray tube normally acted.

The electromagnetic wave-shielding effect was such that an electromagnetic wave of 21.35±1 MHz outside the room was reduced to 90 dB within the room, and since the shielding level was higher than 70 dB ordinarily regulated, the tomographic function of the nuclear magnetic resonance tomographic apparatus was not hindered by the electromagnetic wave intruding from the outside and a photographic image processing can be performed precisely. Thus, it was confirmed that a high effect could be attained by the magnetic and electromagnetic wave shielding panel.

Furthermore, the total weight of the constructed panel of the present device was about 1/20 of the weight of the panel constructed according to the conventional method, and the working term was much shorter than in the conventional method wherein the reinforcing construction was necessary. More specifically, the working term of more than 20 days required in the conventional method was shortened to ⅓ and the construction working was completed in 7 days.

The magnetic and electromagnetic wave shielding panel of this example has an effect of shielding both of the magnetic flux and electromagnetic wave simultaneously, and this panel has a light weight as compared with the conventional and an excellent construction adaptability. Furthermore, the construction working of this panel is completed within a short term and the cost of the magnetic and electromagnetic wave shielding device is very low.

EXAMPLE 7

As shown in FIGS. 16 and 17, a laminate structure was made from two non-oriented silicon steel sheets 21 each having a thickness of 0.35 mm as the high saturation magnetic flux density material, ten amorphous alloy foils 22 each having an alloy composition of $Fe_{79}Si_8B_{13}$ and a thickness of 30 μm as the high magnetic permeability material, and one plywood 20 having a thickness of 4 mm as the non-magnetic material. The side end portions of the laminate structure, bolts 23 and the bolt holes were coated or sealed with a commercially available sealant (HERME-SEAL 30 V) 24.

Figure 18:
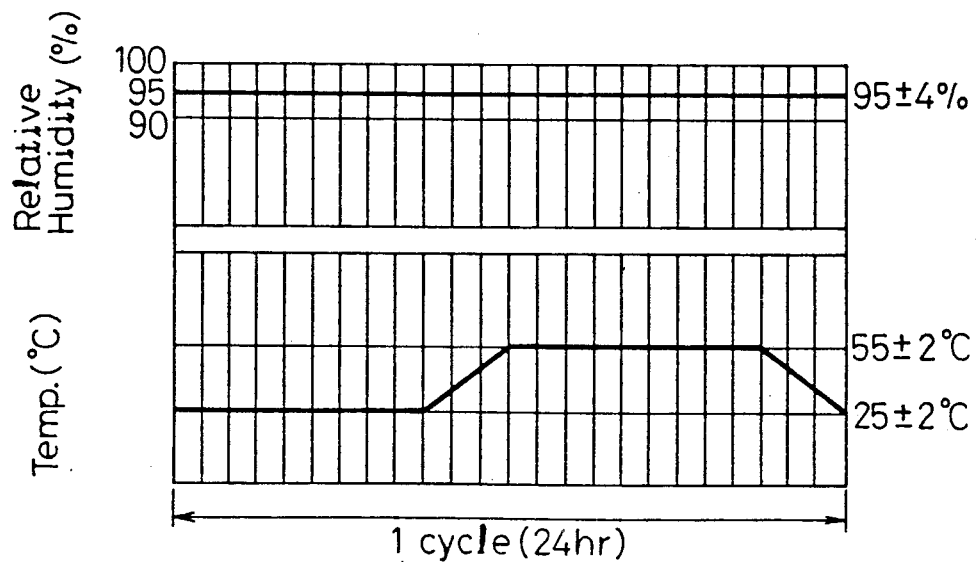

The thus prepared panel was placed under the temperature and humidity cycle conditions shown in FIG. 18. After ten cycles of the temperature and humidity conditions, the panel was disassembled and rust formation in each amorphous foil was tested by visual examination. No rust was found.

For comparison, the same panel as mentioned above was prepared except that the coating and sealing with the sealant was not carried out. The panel was placed under the same temperature and humidity cycle conditions and the rust formation in the amorphous foils was similarly tested. Rust was found on at least about 50% of each amorphous foil.

This example clearly shows that the coating or sealing of the side end portions of the laminate structure, the bolts and the bolt holes is effective for rust prevention.

As is apparent from the foregoing description, in the composite magnetic shielding material of the present invention, the weight is drastically reduced without degradation of the shielding effect of cutting off a strong magnetic field. Accordingly, the transportation adaptability, the handling property and the construction workability can be remarkably improved.

We claim:

1. A magnetic shielding material having a laminate structure comprising a basic laminate comprised of (a) a ferromagnetic sheet having a high saturation magnetic flux density, (b) a non-magnetic sheet and (c) an amorphous ferromagnetic sheet having a high magnetic permeability, said sheets (a), (b) and (c) in the basic laminate being superposed in this order and so that the ferromagnetic sheet (a) confronts a magnetic field-generating source; the ferromagnetic sheet (a) having a saturation magnetic flux density of at least 1.5 Tesla, and the amorphous ferromagnetic sheet (c) having a specific initial permeability of at least 1,000 and composed of an alloy having a composition represented by the formula:

$$FE_a-X_b-M_c$$ 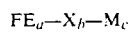

wherein X represents at least one metal selected from the group consisting of Co, Ni, Cr, Mo, Nb, V and Mn, M represents at least one metalloid element selected from the group consisting of B, Si, C, P and Ge; when X is Co or Ni, b is 0 to 40 atomic % and is not larger than a, and c is 10 to 30 atomic %, (a+b+c) is 100 atomic %.

2. A magnetic shield material as set forth in claim 1, wherein the ferromagnet sheet having a high saturation magnetic flux density comprises a layer of at least one member selected from the group consisting of mild steels, silicon steels and iron-cobalt alloys.

3. A magnetic shielding material as set forth in claim 1 wherein the ferromagnetic sheet having a high magnetic permeability is an amorphous alloy foil, a laminate thereof, an annealed amorphous alloy foil or a laminate thereof.

4. A magnetic shielding material as set forth in claim 3 wherein the total thicknness of the amorphous alloy foil or foils or annealed amorphous alloy fill or foils of the ferromagnetic sheet having a high magnetic permeabilty is 50 to 1,000 $\mu$m.

5. A magnetic shielding material as set forth in wherein the ferromagnetic sheet having a high magnetic permeability is an amorphous alloy foil or a laminate thereof, which has a thickness of at least 50 $\mu$m.

6. A magnetic shielding material as set forth in claim 1, wherein the ferromagnetic sheet having a high saturation magnetic flux density has a thickness of 0.1 to 5 mm.

7. A magnetic shielding material as set forth in claim 1, wherein the thickness of the ferromagnetic sheet having a high saturation magnetic flux density has a thickness of 0.3 to 3 mm.

8. A magnetic shielding material as set forth in claim 1, which is in the form of an enclosure structure having rounded corner portions.

9. A magnetic shielding material as set forth in claim 1, wherein the laminate structure further comprises at least one foil of an electromagnetic wave-shielding material.

10. A magnetic shielding material as set forth in claim 9, which is in the form of a panel.

11. A magnetic shielding material as set forth in claim 10, wherein the foil or foils of the electromagnetic wave-shielding material have a size larger than that of the other constituents of the laminate structure.

12. A magnetic shielding material as set forth in claim 1, herein the laminate structure is secured by non-magnetic bolts, and the side end portions of the laminate structure, the bolts and the bolt holes are coated and sealed with a sealant.

* * * * *

UNITED STATES PATENT AND TRADEMARK OFFICE
CERTIFICATE OF CORRECTION

PATENT NO. : 5,045,637

DATED : September 3, 1991

INVENTOR(S) : T. Sato, et al.

Page 1 of 3

It is certified that error appears in the above-identified patent and that said Letters Patent is hereby corrected as shown below:

Column 1, line 23, change "is more" to --has been--.

Column 1, line 26, change "be practically used" to --become practical--.

Column 2, line 26, between "ing" and "example" insert --an--.

Column 2, line 33, delete "the".

Column 3, line 1, change "FIG. 17" to --FIG. 18--.

Column 3, line 22, between "density" and "be" insert --should--.

Column 4, line 66, between "laminate" and "be" insert --should--.

Column 5, line 20 change "10" to --10--.

Column 5, line 53, change "is" to --are--.

Column 6, line 2, change "is" to --are--.

Column 6, line 49, between "foil" and "prefera-" insert --is--.

UNITED STATES PATENT AND TRADEMARK OFFICE
CERTIFICATE OF CORRECTION

PATENT NO. : 5,045,637
DATED : September 3, 1991
INVENTOR(S) : T. Sato, et al.

It is certified that error appears in the above-identified patent and that said Letters Patent is hereby corrected as shown below:

Column 7, lines 9 and 36, after "plywood" insert --sheet--.

Column 8, line 6, after "sheet 1" insert --and--, and after "plywood" insert --sheet--.

Column 9, line 15, change "nuclea" to --nuclear--.

Column 9, line 32, change "5 gauss from" to --5 gauss to--.

Column 9, line 37, change "normally acted" to --acted normally--.

Column 10, line 9, after "plywood" insert --sheet--.

Column 11 line 5, change "fill" to --foil--.

Column 11, line 8, after "in" insert --claim 1--.

UNITED STATES PATENT AND TRADEMARK OFFICE
CERTIFICATE OF CORRECTION

PATENT NO. : 5,045,637

DATED : September 3, 1991

INVENTOR(S) : T. Sato, et al.

It is certified that error appears in the above-identified patent and that said Letters Patent is hereby corrected as shown below:

Column 12, line 15, change "herein" to --wherein--.

Signed and Sealed this

Sixth Day of April, 1993

Attest:

STEPHEN G. KUNIN

*Attesting Officer*   *Acting Commissioner of Patents and Trademarks*